United States Patent
Yamaguchi et al.

(10) Patent No.: US 12,159,784 B2
(45) Date of Patent: Dec. 3, 2024

(54) SUBSTRATE PROCESSING APPARATUS AND SUBSTRATE PROCESSING METHOD

(71) Applicant: SCREEN Holdings Co., Ltd., Kyoto (JP)

(72) Inventors: Yuji Yamaguchi, Kyoto (JP); Masayuki Orisaka, Kyoto (JP); Saki Miyagawa, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 302 days.

(21) Appl. No.: 17/802,135

(22) PCT Filed: Jan. 13, 2021

(86) PCT No.: PCT/JP2021/000810
§ 371 (c)(1),
(2) Date: Aug. 24, 2022

(87) PCT Pub. No.: WO2021/171810
PCT Pub. Date: Sep. 2, 2021

(65) Prior Publication Data
US 2023/0074202 A1 Mar. 9, 2023

(30) Foreign Application Priority Data
Feb. 28, 2020 (JP) .................................. 2020-032784

(51) Int. Cl.
*H01L 21/02* (2006.01)
*H01L 21/67* (2006.01)

(52) U.S. Cl.
CPC .. *H01L 21/02101* (2013.01); *H01L 21/67023* (2013.01); *H01L 21/67248* (2013.01)

(58) Field of Classification Search
CPC ......... H01L 21/67248; H01L 21/67023; H01L 21/02101
See application file for complete search history.

(56) References Cited

U.S. PATENT DOCUMENTS

| 2007/0022949 | A1  | 2/2007 | Saito |
|---|---|---|---|
| 2008/0230096 | A1* | 9/2008 | Kawamura ....... H01L 21/67115 134/98.1 |

(Continued)

FOREIGN PATENT DOCUMENTS

| JP | 2007036109 A | 2/2007 |
|---|---|---|
| JP | 2011192835 A | 9/2011 |

(Continued)

OTHER PUBLICATIONS

International Search Report mailed Mar. 30, 2021 in corresponding PCT International Application No. PCT/JP2021/000810.

(Continued)

*Primary Examiner* — Kaitlin S Joerger
(74) *Attorney, Agent, or Firm* — OSTROLENK FABER LLP

(57) ABSTRACT

A substrate processing apparatus according to the invention executes a substrate processing using a supercritical processing fluid. In a processing container, a first introduction port is formed in such a manner as to face space over a substrate in the processing space and a second introduction port is formed in such a manner as to face space under a support tray in the processing space. A first discharge port is formed in such a manner as to face space over the support tray and a second discharge port is formed in such a manner as to face the space under the support tray. The supercritical processing fluid having a higher temperature is supplied into the processing space through the first introduction port, and the supercritical processing fluid having a lower temperature is supplied into the processing space through the second introduction port.

11 Claims, 8 Drawing Sheets

(56) References Cited

U.S. PATENT DOCUMENTS

| | | | |
|---|---|---|---|
| 2011/0220152 A1 | 9/2011 | Kitajima et al. | |
| 2017/0098555 A1 | 4/2017 | Gouk et al. | |
| 2018/0138035 A1 | 5/2018 | Ohno et al. | |
| 2018/0138058 A1 | 5/2018 | Egashira et al. | |
| 2018/0138060 A1 | 5/2018 | Okamura et al. | |
| 2018/0358242 A1 | 12/2018 | Kim et al. | |
| 2020/0047224 A1 | 2/2020 | Fukui et al. | |
| 2020/0388512 A1* | 12/2020 | Biwa | H01L 21/02101 |
| 2020/0411334 A1* | 12/2020 | Sumi | B08B 5/00 |
| 2020/0411336 A1* | 12/2020 | Sumi | B08B 5/00 |
| 2021/0159095 A1* | 5/2021 | Ihara | H01L 21/02101 |
| 2023/0066729 A1* | 3/2023 | Wang | C23C 16/45557 |
| 2023/0073624 A1* | 3/2023 | Shimomura | H01L 21/02057 |
| 2024/0162034 A1* | 5/2024 | Sumi | H01L 21/68742 |
| 2024/0194496 A1* | 6/2024 | Umezaki | H01L 21/67028 |

FOREIGN PATENT DOCUMENTS

| | | |
|---|---|---|
| JP | 2015039040 A | 2/2015 |
| JP | 2018081966 A | 5/2018 |
| JP | 2018-207076 A | 12/2018 |
| TW | 201830562 A | 8/2018 |
| TW | 201832289 A | 9/2018 |
| TW | 202008487 A | 2/2020 |

OTHER PUBLICATIONS

Written Opinion mailed Mar. 30, 2021 in corresponding PCT International Application No. PCT/JP2021/000810.

Notice of Allowance dated Jun. 7, 2024 issued in corresponding Korean Patent Application No. 10-2022-7031755 with English translation.

* cited by examiner

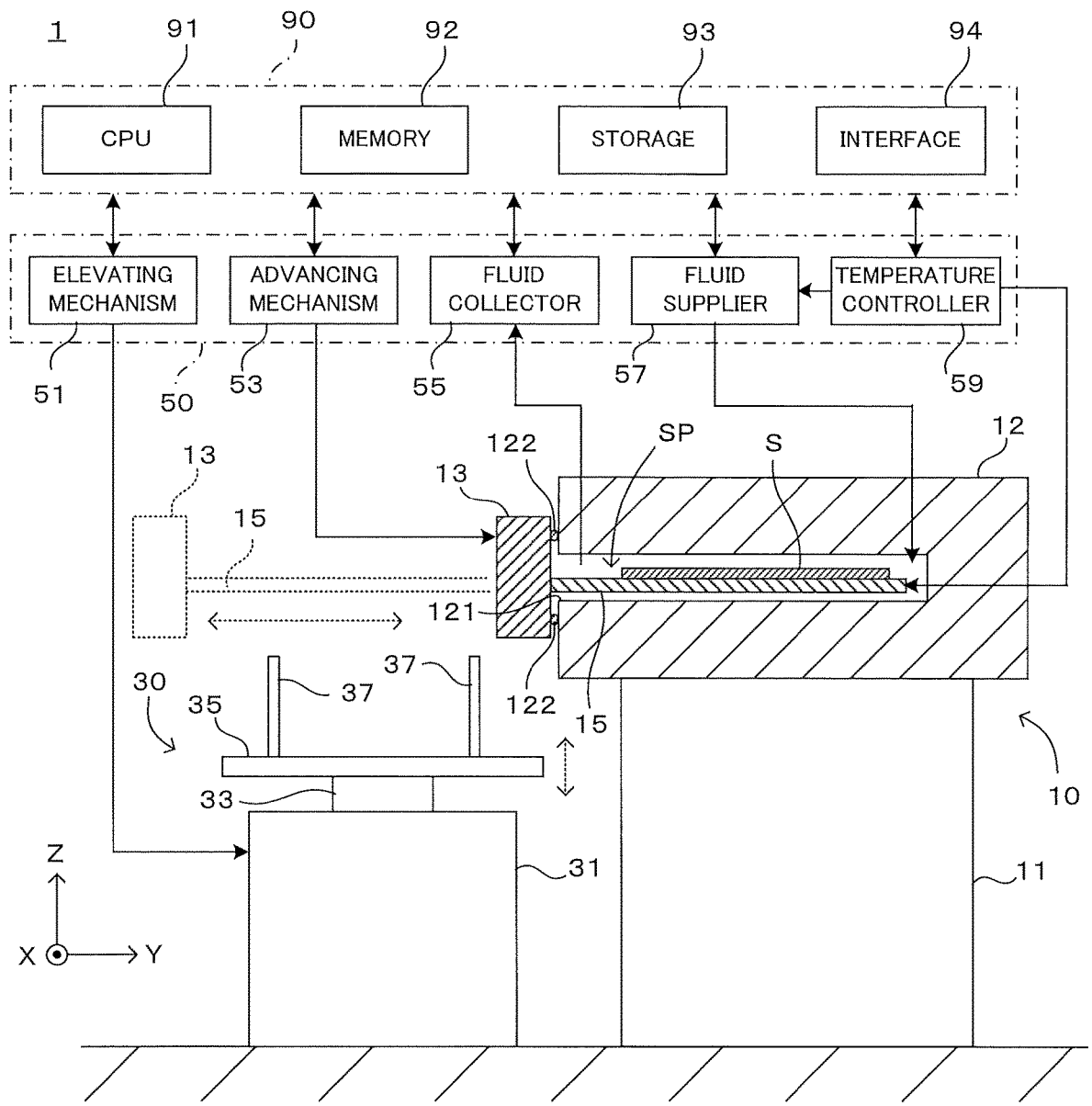
F I G. 1

SUBSTRATE PROCESSING APPARATUS AND SUBSTRATE PROCESSING METHOD

CROSS-REFERENCE TO RELATED APPLICATIONS

The present application is a 35 U.S.C. §§ 371 national stage application of International Application No. PCT/JP2021/000810 filed Jan. 13, 2021, which claims priority to Japanese Patent Application No. 2020-032784, filed Feb. 28, 2020, the contents of which are incorporated herein by reference.

TECHNICAL FIELD

The present invention relates to a substrate processing technique of processing a substrate using a processing fluid in a supercritical state inside a processing container.

BACKGROUND ART

In processing steps for various types of substrates such as semiconductor substrates, glass substrates for display devices, etc., a processing to substrates with various types of processing fluids may be included. In some cases, such a process is performed in an airtight processing container for the purpose of using a processing fluid efficiently or preventing dissipation of the processing fluid to the outside. In this case, the processing container is provided with an opening for incoming and outgoing transport of a substrate, and a lid part for ensuring airtightness in internal space by closing the opening. For example, in a processing apparatus disclosed in PTL 1, a substrate (wafer) to be processed is transported into a processing container in a state of being placed on a holder which has a flat plate shape and is integrated with a lid part. Then, a processing fluid in a supercritical state is introduced to process the substrate. Internal space in the processing container is formed into a size slightly greater than an outer shape enveloping the substrate and the holder. Therefore, the amount of use of the processing fluid is reduced and improvement of processing efficiency is allowed.

According to this conventional technique, the processing fluid in a supercritical state is supplied toward the upper surface of the substrate from a lateral side opposite the opening as viewed from the substrate. When the processing fluid returns after passing through the vicinity of the opening and traveling along the lower surface of the substrate, the processing fluid is discharged to the outside (FIG. 5, for example). At this time, impurity arising from a sealing member for maintaining airtightness of the opening might adhere to the substrate. The above-described conventional technique employs a double sealing mechanism and uses a material of a high corrosion resistance for a sealing member to contact the processing fluid, thereby reducing the occurrence of impurity.

CITATION LIST

Patent Literature

[PTL 1] JP2015-039040A

SUMMARY OF INVENTION

Technical Problem

More generally, impurity having mixed into the processing fluid is prevented from adhering to the substrate by avoiding contact of the processing fluid having passed through around the opening with the substrate. For example, passing a clean processing fluid in one direction along the substrate prevents impurity arising downstream from the substrate from adhering to the substrate. In this case, in the processing container, a laminar flow without disturbance is ideally formed along each of the upper surface and the lower surface of the substrate.

However, it is actually not easy to fulfill such a condition. For example, a turbulent flow might be caused by reason such as a current of the processing fluid generated between an upper layer and a lower layer relative to the substrate through a gap between the holder and the processing container or through an opening provided to the holder, or convection developed by a difference in temperature between a member in the processing container and the processing fluid. By the occurrence of such a turbulent flow in the processing container, impurity carried by this flow adheres to a surface of the substrate to contaminate the substrate.

Solution to Problem

The present invention has been made in view of the above-described problem. In connection with a substrate processing technique of processing a substrate in a processing container using a processing fluid in a supercritical state, an object of the present invention is to provide a technique that makes it possible to prevent impurity having mixed in a processing fluid from being carried by a turbulent flow and from adhering to a substrate.

One aspect of the present invention is intended for a substrate processing apparatus including: a support tray of a shape like a flat plate on which a lower surface of a substrate in a horizontal posture is supported; a processing container including a container body and a lid part, the container body being provided with processing space configured to house the support tray supporting the substrate, and an aperture communicating with the processing space and used for causing the support tray to pass therethrough, the lid part being configured to open and close the aperture; and a fluid supplier that supplies a processing fluid for supercritical process into the processing space. Another aspect of the present invention is intended for a substrate processing method of processing a substrate with a processing fluid in a supercritical state in a processing container.

In these inventions, the processing container is provided with: a first introduction port formed external to one end of the substrate in a plan view in such a manner as to face space over the substrate in the processing space and a second introduction port formed external to the one end in such a manner as to face space under the support tray in the processing space as introduction ports which introduce the processing fluid to the processing space: and a first discharge port formed external to an other end of the substrate opposite the one end in a plan view in such a manner as to face space over the support tray in the processing space and a second discharge port formed external to the other end in such a manner as to face the space under the support tray in the processing space as discharge ports which discharge the processing fluid from the processing space. Furthermore, the processing fluid in a supercritical state and at a predetermined first temperature is supplied into the processing space through the first introduction port, and the processing fluid in a supercritical state and at a second temperature lower than the first temperature is supplied into the processing space through the second introduction port.

According to the inventions thus configured, the processing fluid is introduced into the processing space from a side closer to the one end of the substrate, and the processing fluid is discharged from a side closer to the other end of the substrate. Moreover, the processing fluid is introduced and discharged in each of the space over the substrate and the space under the substrate individually in the processing space. As a result, laminar flows of the processing fluid traveling in one direction from the one end toward the other end are formed both over and under the substrate. Here, "being under the substrate" means an idea of being under the support tray if the lower surface of the substrate is covered with the support tray.

A factor for disturbing a laminar flow includes imbalance between the amount of supply and the amount of discharge of the processing fluid, imbalance in flow rate or flow speed between the over side and the under side, convection due to fluctuation of the temperature of the processing fluid caused by a difference in temperature between members in the processing space including the substrate and the support tray and the processing fluid, etc. In particular, under temperature and pressure conditions close to degrees at a critical point, slight change in these conditions makes large change in the density of the processing fluid in a supercritical state. These factors cause a current of the processing fluid between a laminar flow along the upper surface and a laminar flow along the lower surface of the substrate, thereby developing a turbulent flow. As described above, the turbulent flow might cause contamination of the substrate.

According to the present invention, a difference in temperature is generated between the processing fluid supplied over the substrate and the processing fluid supplied under the substrate. More specifically, the processing fluid supplied over the substrate is at a higher temperature. The processing fluid supplied over the substrate and the processing fluid supplied under the substrate are fed to the same space and at the same pressure. For this reason, the difference in temperature results in a difference in density. Specifically, while the processing fluid at a relatively high temperature and a relatively low density is supplied over the substrate, the processing fluid at a relatively low temperature and a relatively high density is supplied under the substrate. This difference in density functions to suppress a current of the processing fluid between the upper layer and the lower layer. As a result, the occurrence of a turbulent flow is reduced while the problem of carrying of impurity by a turbulent flow and adherence of the impurity to the substrate is avoided.

Advantageous Effects of Invention

As described above, according to the present invention, laminar flows of the processing fluid traveling in one direction are formed both over and under the substrate in the processing space inside the processing container. Moreover, the temperature of the processing fluid is higher over the substrate than under the substrate. This reduces the occurrence of a turbulent flow due to a current of the processing fluid between the upper layer and the lower layer, making it possible to effectively prevent impurity from being carried by a turbulent flow and from adhering to the substrate.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF DRAWINGS

FIG. 1 is a drawing showing a schematic configuration of one embodiment of a substrate processing apparatus according to the invention.

DESCRIPTION OF EMBODIMENTS

Figure 2:
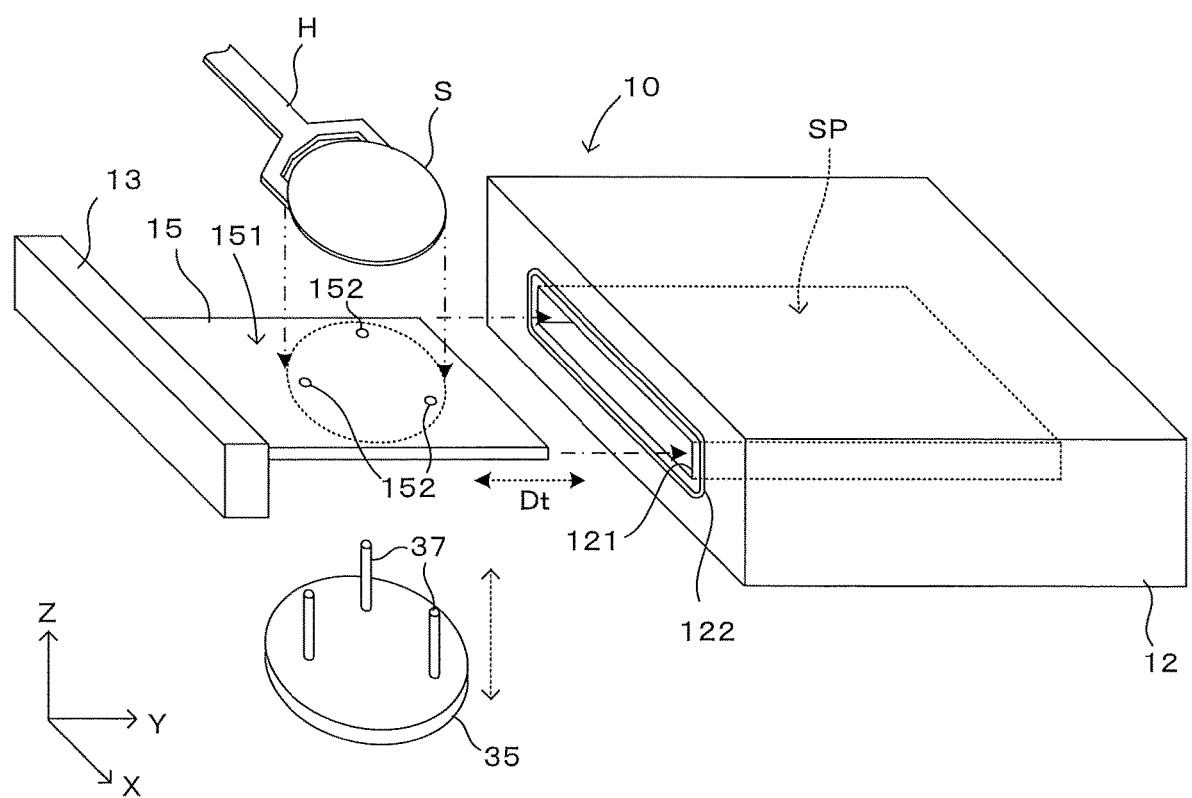
FIG. 2 is a perspective view showing a principal part of the processing unit.

FIG. 1 is a drawing which shows a schematic configuration of one embodiment of a substrate processing apparatus according to the invention. This substrate processing apparatus 1 is an apparatus for processing surfaces of various substrates such as semiconductor substrates using supercritical fluids. To show directions in each figure in a unified manner below, an XYZ orthogonal coordinate system is set as shown in FIG. 1. Here, an XY plane represents a horizontal plane and a Z direction represents a vertical direction. More specifically, a (−Z) direction represents a vertically downward direction.

Various substrates such as semiconductor wafers, glass substrates for photomask, glass substrates for liquid crystal display, glass substrates for plasma display, substrates for FED (Field Emission Display), substrates for optical disk, substrates for magnetic disk, substrates for magneto-optical disk can be adopted as the "substrate" in this embodiment. A substrate processing apparatus used to process a semiconductor wafer is mainly described as an example with reference to the drawings, but the substrate processing apparatus can be adopted also to process various substrates illustrated above. Also as a shape of the substrate, various types are applicable.

The substrate processing apparatus 1 includes a processing unit 10, a transfer unit 30, a supply unit 50 and a control unit 90. The processing unit 10 serves as an execution subject of a supercritical drying process. The transfer unit 30 receives an unprocessed substrate S transported by an external transport apparatus not shown in the figure and carries the substrate S into the processing unit 10. Further, the transfer unit 30 delivers a processed substrate S from the processing unit 10 to the external transport apparatus. The supply unit 50 supplies chemical substances and power necessary for the process to the processing unit 10 and the transfer unit 30.

The control unit 90 realizes a predetermined process by controlling these components of the apparatus. For this purpose, the control unit 90 includes a CPU 91, a memory 92, a storage 93, an interface 94, and the like. The CPU 91 executes various control programs. The memory 92 temporarily stores processing data. The storage 93 stores the control programs to be executed by the CPU 91. The interface 94 exchanges information with a user and an external apparatus. Operations of the apparatus to be described later are realized by the CPU 91 causing each component of the apparatus to perform a predetermined operation by executing the control program written in the storage 93 in advance.

The processing unit 10 has a structure in which a processing chamber 12 is settled on a pedestal 11. The processing chamber 12 is structured by a combination of several metal blocks which form a hollow inside serving as a processing space SP. A substrate S to be processed is carried into the processing space SP to be processed. A slit-like aperture 121 elongated in an X direction is formed in a (−Y) side surface of the processing chamber 12. The processing space SP communicates with an outside space via the aperture 121.

A lid part 13 is provided on the (−Y) side surface of the processing chamber 12 to close the aperture 121. By doing so, a processing to the substrate S under a high pressure in the internal processing space SP is allowed. A support tray 15 in the form of a flat plate is attached in a horizontal posture to a (+Y) side surface of the lid part 13. The upper surface of the support tray 15 serves as a support surface on which the substrate S can be placed. The lid part 13 is supported horizontally movably in a Y direction by an unillustrated support mechanism.

The lid part 13 is movable toward and away from the processing chamber 12 by an advancing mechanism 53 provided in the supply unit 50. Specifically, the advancing mechanism 53 includes a linear mechanism such as a linear motor, a linear guide, a ball-screw mechanism, a solenoid or an air cylinder. Such a linear mechanism moves the lid part 13 in the Y direction. The advancing mechanism 53 operates in response to a control command from the control unit 90.

By a movement of the lid part 13 in a (−Y) direction, the lid part 13 separates away from the processing chamber 12 and the support tray 15 is pulled out from the processing space SP to outside via the aperture 121. By doing so, the support tray 15 is accessible from outside. Specifically, it becomes possible to place the substrate S on the support tray 15 and take out the substrate S placed on the support tray 15. On the other hand, the lid part 13 moves in a (+Y) direction, whereby the support tray 15 is accommodated into the processing space SP. If the substrate S is placed on the support tray 15, the substrate S is carried into the processing space SP together with the support tray 15.

The lid part 13 moves in the (+Y) direction to close the aperture 121, whereby the processing space SP is sealed. A sealing member 122 is provided between the (+Y) side surface of the lid part 13 and the (−Y) side surface of the processing chamber 12 and an airtight state of the processing space SP is maintained. The seal member 12 is made of rubber material, for example. Further, the lid part 13 is fixed to the processing chamber 12 by an unillustrated lock mechanism. As described above, in this embodiment, the lid part 13 is switched between a closing state (solid line) to close the aperture 121 and seal the processing space SP and a separating state (dotted line) to enable the substrate S to pass through by separating widely from the aperture 121.

The substrate S is processed in the processing space SP with the airtight state of the processing space SP ensured in this way. In this embodiment, a fluid of a substance usable for a supercritical process, e.g. carbon dioxide, is sent from a fluid supplier 57 provided in the supply unit 50 as the processing fluid. The processing fluid is supplied to the processing unit 10 in a gaseous, liquid or supercritical state. Carbon dioxide enters a supercritical state at relatively low temperature and low pressure and is a chemical substance suitable for the supercritical drying process in having a property of dissolving an organic solvent often used in substrate processing well. At a critical point of carbon dioxide at which the fluid comes into the supercritical state, a pressure (critical pressure) is 7.38 MPa and a temperature (critical temperature) is 31.1° C.

The processing fluid is poured into the processing space SP. When the interior of the processing space SP reaches an appropriate temperature and an appropriate pressure, the processing space SP becomes filled with the processing fluid in a supercritical state. By doing so, the substrate S is processed using the supercritical fluid in the processing chamber 12. The supply unit 50 is provided with a fluid collector 55 and the fluid after the process is collected by the fluid collector 55. The fluid supplier 57 and the fluid collector 55 are controlled by the control unit 90.

To prevent the processing fluid in a supercritical state from being cooled to be changed in phase in the processing chamber 12, a suitable heat source is preferably provided in the processing chamber 12. In particular, in the present embodiment, to prevent the occurrence of unintentional phase change around the substrate S, a built-in heater (not shown in the drawings) is provided in the support tray 15. The heater is controlled in temperature by a temperature controller 59 of the supply unit 50. The temperature controller 59 operates in response to a control command from the control unit 90 and also has the function of controlling the temperature of a processing fluid supplied from the fluid supplier 57, as described later.

The processing space SP has a shape and a capacity in which the support tray 15 and the substrate S supported on the support tray 15 are receivable. Specifically, the processing space SP has a rectangular sectional shape greater in the horizontal direction than the width of the support tray 15 and greater in the vertical direction than a height covering the support tray 15 and the substrate S, and has a depth with which the support tray 15 is receivable. In this way, the processing space SP has a shape and a capacity sufficient for receiving the support tray 15 and the substrate S. Meanwhile, only a slight gap is formed from the support tray 15 and the substrate S to an inner wall surface of the processing space SP. Thus, the processing fluid necessary for filling the processing space SP can be controlled to a relatively small amount.

The transfer unit 30 is responsible for transfer of the substrate S between the external transport device and the support tray 15. For this purpose, the transfer unit 30 includes a body 31, an up/down member 33, a base member 35, and a plurality of lift pins 37. The up/down member 33 is a columnar member extending in the Z direction and is supported movably in the Z direction by a support mechanism not shown in the drawings. The base member 35 having a substantially horizontal upper surface is attached on the up-and-down member 33. The lift pins 37 are provided upward in standing positions from the upper surface of the base member 35. Each of the lift pins 37 has an upper end to abut on the lower surface of the substrate S, thereby supporting the substrate S from below in a horizontal posture. To support the substrate S stably in a horizontal posture, it is desirable to provide three or more lift pins 37 having upper ends of substantially equal heights.

The up/down member 33 can be moved up and down by an elevating mechanism 51 provided to the supply unit 50. More specifically, the elevating mechanism 51 includes a linear-motion mechanism such as a liner motor, a linear-motion guide, a ball screw mechanism, a solenoid, or an air cylinder, for example, and such a linear-motion mechanism moves the up/down member 33 in the Z direction. The elevating mechanism 51 operates in response to a control command from the control unit 90.

The up/down movement of the up/down member 33 moves the base member 35 up and down, and moves the lift pins 37 integrally with the base member 35. By doing so, the substrate S is transferred between the transfer unit 30 and the support tray 15.

FIG. 2 is a perspective view showing a principal part of the processing unit. When the lid part 13 is in a separated state where the lid part 13 is moved in the (-Y) direction, the support tray 15 is in a state of being pulled out to outer space from the processing chamber 12. The base member 35 with the lift pin 37 is arranged under the support tray 15 in this state. A through hole 152 of a larger diameter than the diameter of the lift pin 37 is formed at the support tray 15 at a position directly above the lift pin 37.

When the base member 35 moves up, the upper end of the lift pin 37 is passed through the through hole 152 to reach a position higher than a support surface 151 of the support tray 15. In this state, the substrate S being supported and transported on a hand H of the external transport device is transferred to the lift pin 37. After the hand H retreats, the lift pin 37 moves down to transfer the substrate S from the lift pin 37 to the support tray 15. The substrate S can be ejected through a procedure reverse to that described above.

Figure 3:
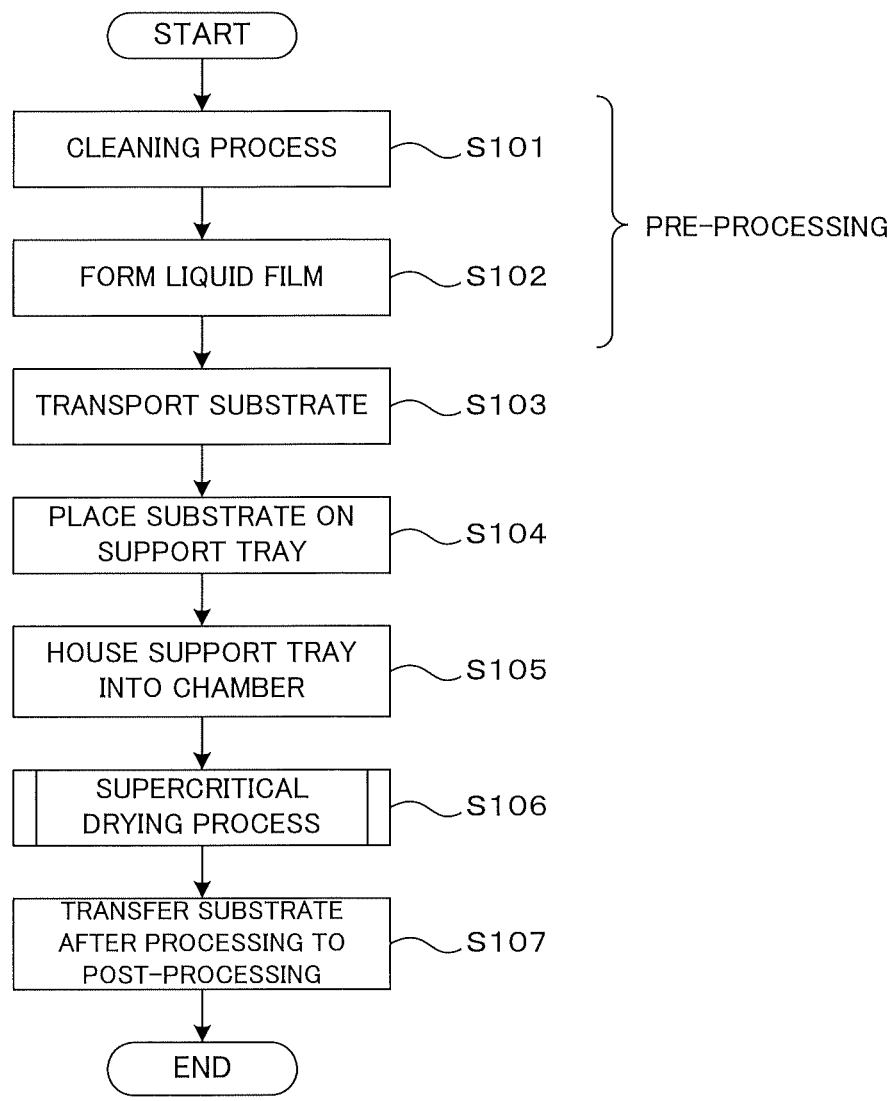
FIG. 3 is a flowchart showing part of the process performed by a substrate processing system including the substrate processing apparatus.

FIG. 3 is a flowchart showing part of the process performed by a substrate processing system including the above-described substrate processing apparatus. The substrate processing apparatus 1 is used to dry the substrate S after being cleaned with a cleaning liquid in a previous step. This process is described in detail next. After cleaning with a cleaning liquid in a pre-processing (step S101), while the substrate S is given a liquid film made of isopropyl alcohol (IPA) formed on its surface (step S102), the substrate S is transported to the substrate processing apparatus 1 (step S103).

For example, a fine pattern formed on a surface of the substrate S causes a risk of collapse of the pattern due to the surface tension of a remaining liquid adhering to the substrate S. In another case, a watermark may remain on the surface of the substrate S due to insufficient drying. In another case, alteration such as oxidation may be caused if the surface of the substrate S contacts outside air. To prevent these problems before they occur, the substrate S may be transported while the surface (pattern forming surface) of the substrate S is covered with a liquid or solid surface layer.

If the cleaning liquid is mainly composed of water, for example, the substrate W is transported while the substrate S is given a liquid film formed using a liquid lower in surface tension and less corrosive to a substrate than water that may be an organic solvent such as IPA or acetone, for example. Specifically, the substrate S is transported to the substrate processing apparatus 1 while being supported in a horizontal state and given the liquid film formed on its upper surface.

The substrate S is placed on the support tray 15 while the pattern forming surface is positioned as an upper surface and the upper surface is covered with the thin liquid film (step S104). When the support tray 15 and the lid part 13 move integrally in a (+Y) direction, the support tray 15 supporting the substrate S is housed in the processing space SP in the processing chamber 12 and the aperture 121 is closed by the lid part 13 (step S105).

At the processing space SP to which the substrate S is carried with the support tray 15 and which is sealed, a supercritical drying process is executed (step S106). The processed substrate S is sent to a subsequent step (step S107). Specifically, the lid part 13 moves in a (-Y) direction to pull out the support tray 15 from the processing chamber 12 to the outside. The substrate S is transferred to the external transport device via the transfer unit 30. At this time, the substrate S is in a dried state. The substance of the subsequent step is determined freely.

Figure 4:
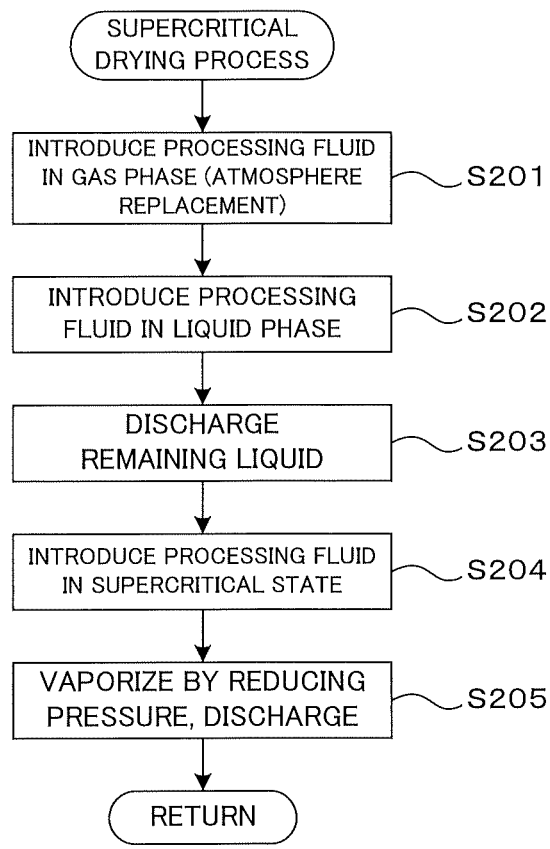
FIG. 4 is a flowchart showing processing steps of the supercritical drying process.

FIG. 4 is a flowchart showing processing steps of the supercritical drying process. While carbon dioxide ($CO_2$) is used as a processing fluid in a case described below, this is not the only type of the processing fluid. When the substrate S provided with a liquid film is transported from outside into the processing chamber 12, the processing fluid is first introduced in a gas phase into the processing space SP (step S201). By feeding the processing fluid in a gas phase state while exhausting air from the processing space SP, an atmosphere in the processing space SP is replaced with the processing fluid.

Next, the processing fluid in a liquid phase is introduced into the processing space SP (step S202). The liquid carbon dioxide dissolves the liquid well (organic solvent such as IPA, for example) forming the liquid film on the substrate to isolate the liquid from the upper surface of the substrate S. Discharging the liquid in the processing space SP allows discharge of the IPA remaining on the substrate S (step S203).

Next, the processing fluid in a supercritical state is introduced into the processing space SP (step S204). The processing fluid brought into a supercritical state in advance outside the processing chamber 12 may be introduced. In another configuration, the processing fluid may be brought into a supercritical state by setting a temperature and a pressure in the processing chamber 12 filled with the liquid processing fluid to degrees equal to or greater than those at a critical point.

Then, a pressure in the processing chamber 12 is reduced while a temperature therein is maintained. As a result, the supercritical fluid is vaporized without passing through a liquid phase and discharged (step S205). By doing so, the substrate S is placed in a dried state. During this process, a pattern forming surface of the substrate S is not exposed to an interface between a liquid phase and a gas phase to prevent the occurrence of pattern collapse due to the surface tension of the liquid. Furthermore, the surface tension of the supercritical fluid is extremely low. Thus, even at a substrate having a surface provided with a fine pattern, the processing fluid still comes well into the pattern. This allows a liquid, etc. remaining in the pattern to be replaced efficiently. In this way, the substrate S is dried favorably.

As described above, in the present embodiment, the liquid component remaining on the substrate S is removed to dry the substrate S by filling the processing space SP in the processing chamber 12 housing the substrate S with the supercritical fluid. Thus, if the supercritical fluid to contact the substrate S contains impurity, the impurity adheres as a residue to the dried substrate S to contaminate the substrate S.

A source of such contamination includes a residue of the liquid adhering to the substrate S during its incoming transport, impurity carried into the processing space SP from outside, etc. Particularly in the vicinity of the aperture 121 of the processing chamber 12, impurity coming from outer space during incoming or outgoing transport of the substrate S or impurity arising from a member such as the sealing member 122 may be mixed into the processing fluid. The following description is intended for action adopted in the present embodiment to prevent the substrate S from being contaminated with impurity during the supercritical drying process.

Figure 5A:
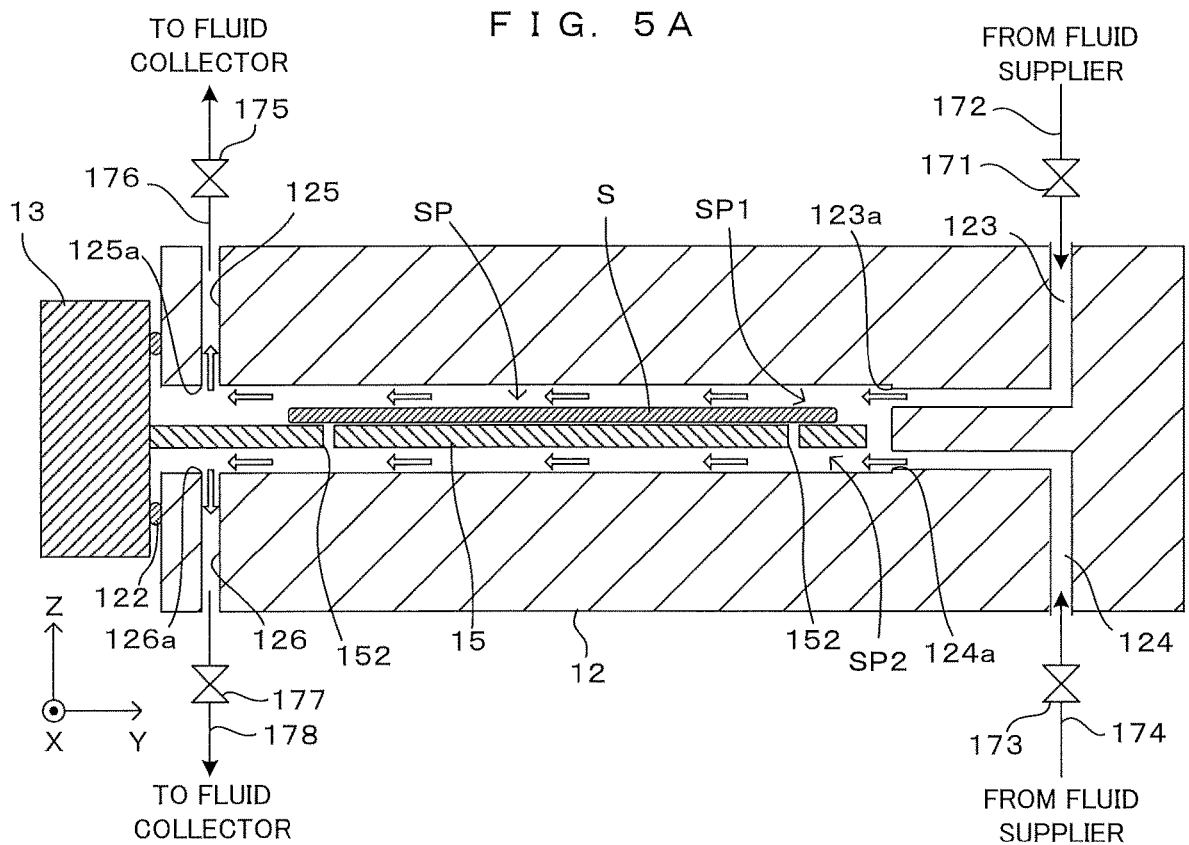
FIG. 5A is a drawing schematically showing a flow of the processing fluid in the processing space.
Figure 5B:
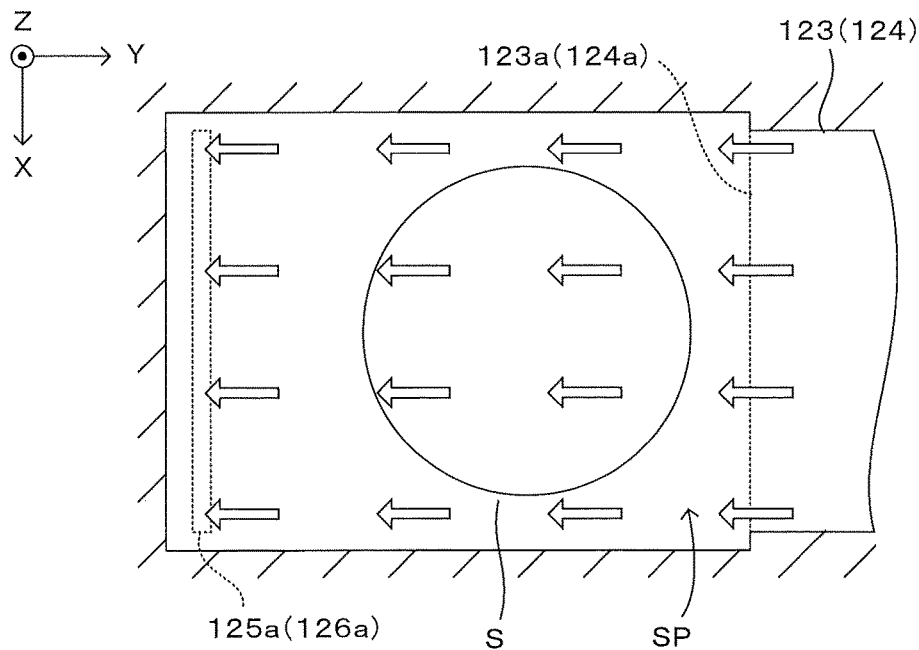
FIG. 5B is a drawing schematically showing a flow of the processing fluid in the processing space.

FIGS. 5A and 5B schematically show a flow of the processing fluid in the processing space. More specifically, FIG. 5A is a sectional view taken in the vertical direction showing the interior of the processing chamber 12. FIG. 5B is a sectional view taken in the horizontal direction showing the processing space SP and its peripherals.

As shown in FIG. 5A, the fluid supplier 57 that supplies the processing fluid is connected to an introduction flow passage 123 and an introduction flow passage 124 provided on the (+Y) side of the processing space SP, namely, on the opposite side of the aperture 121 as viewed from the processing space SP. More specifically, the first introduction flow passage 123 and the second introduction flow passage 124 are formed at the processing chamber 112 external to an end of the substrate S on the (+Y) side housed in the processing space SP, namely, closer to the (+Y) side than this end.

The first introduction flow passage 123 is connected to the fluid supplier 57 through a pipe 172 with a valve 171. Opening the valve 171 causes the processing fluid from the fluid supplier 57 to flow into the first introduction flow passage 123. While the fluid is set to finally flow in the horizontal direction, the processing fluid is ejected from the first introduction flow passage 123 through a first introduction port 123a formed in such a manner as to face the processing space SP at an end of the processing space SP on the (+Y) side.

Meanwhile, the second introduction flow passage 124 is connected to the fluid supplier 57 through a pipe 174 with a valve 173. Opening the valve 173 causes the processing fluid from the fluid supplier 57 to flow into the second introduction flow passage 124. While the fluid is set to finally flow in the horizontal direction, the processing fluid is ejected from the second introduction flow passage 124 through a second introduction port 124a formed in such a manner as to face the processing space SP at the end of the processing space SP on the (+Y) side.

As shown in FIG. 5A, the first introduction port 123a is formed in such a manner as to face processing space SP1 over the substrate S held in the processing space SP. Meanwhile, the second introduction port 124a is formed in such a manner as to face processing space SP2 under the substrate S held in the processing space SP, in a more precise sense, under the support tray 15 supporting the substrate S. Each of the first introduction port 123a and the second introduction port 124a is an aperture like a slit with a constant opening width extending in an elongated shape in the X direction. As shown in FIG. 5B, each of the first introduction port 123a and the second introduction port 124a extends more externally than an end of the substrate S as viewed in the X direction. Thus, the processing fluid ejected from each of the first introduction port 123a and the second introduction port 124a is introduced into the processing space SP as a flow toward the (-Y) direction in the form of a thin layer having a small thickness in a top-bottom direction (Z direction) and having a greater width in the X direction than the substrate S. As long as the processing fluid finally ejected from each of the first introduction port 123a and the second introduction port 124a is in a direction that is substantially the horizontal direction, the shapes of the intermediate flow passages are not limited to those illustrated in the drawings.

In terms of the purpose of the process of filling the periphery of the substrate S with the supercritical fluid, the option of not discharging the processing fluid until the processing space SP is filled with the supercritical fluid is applicable. However, such an option might cause a situation where the processing fluid stays in the processing space SP, and impurity existing in the processing space SP adheres to the substrate S to contaminate the substrate S. To prevent this, the processing fluid is desirably discharged even in a supercritical state to always supply the substrate S with a clean processing fluid.

To achieve this, a first discharge flow passage 125 and a second discharge flow passage 126 for discharge of the processing fluid are provided in the vicinity of an end of the processing space SP on the (-Y) side. More specifically, a first discharge port 125a is formed at a ceiling surface of the processing space SP closer to the (-Y) side than the substrate S housed in the processing space SP. The first discharge flow passage 125 communicating with the first discharge port 125a is connected to the fluid collector 55 through a pipe 176 with a valve 175. Opening the valve 175 causes the processing fluid in the processing space SP to discharge to the fluid collector 55 through the first discharge flow passage 125.

Meanwhile, a second discharge port 126a is formed at a bottom surface of the processing space SP still closer to the (-Y) side than an end of the substrate S on the (-Y) side housed in the processing space SP. The second discharge flow passage 126 communicating with the second discharge port 126a is connected to the fluid collector 55 through a pipe 178 with a valve 177. Opening the valve 177 causes the processing fluid in the processing space SP to discharge to the fluid collector 55 through the second discharge flow passage 126.

As shown in FIG. 5B, each of the first discharge port 125a and the second discharge port 126a is an aperture like a slit with a constant opening width extending in an elongated shape in the X direction. These openings extend more externally than the end of the substrate S as viewed in the X direction and are formed closer to the (-Y) side than the end of the substrate S on the (-Y) side as viewed in the Y direction. The processing space SP is practically divided in the top-bottom direction by the support tray 15 in the vicinity of the locations of these openings. Thus, while the processing fluid flowing over the substrate S is discharged from the first discharge port 125a, the processing fluid flowing under the substrate S is discharged from the second discharge port 126a.

Degrees of opening of the valves 171 and 175 are adjusted in such a manner as to provide equality between the flow rate of the processing fluid to be supplied to the first introduction flow passage 123 and the flow rate of the processing fluid to be discharged from the first discharge flow passage 125. Likewise, degrees of opening of the valves 173 and 177 are adjusted in such a manner as to provide equality between the flow rate of the processing fluid to be supplied to the second introduction flow passage 124 and the flow rate of the processing fluid to be discharged from the second discharge flow passage 126.

With these configurations, the processing fluid introduced from the fluid supplier 57 through the first introduction flow passage 123 is ejected from the first introduction port 123a in a substantially horizontal direction, flows along the upper surface of the substrate S, and is finally discharged from the first discharge port 125a to the outside and collected by the fluid collector 55. Meanwhile, the processing fluid introduced from the fluid supplier 57 through the second introduction flow passage 124 is ejected from the second introduction port 124a in a substantially horizontal direction, flows along the lower surface of the support tray 15, and is finally discharged from the second discharge port 126a to the outside and collected by the fluid collector 55. Specifically, in the processing space SP, laminar flows of the processing fluid toward the (−Y) direction are expected to be formed both over the substrate S and under the support tray 15. Blank arrows shown in FIGS. 5A and 5B schematically indicate such flows of the processing fluid.

As described above, forming a laminar flow of the processing fluid toward one direction in the processing space SP, particularly in space over the substrate S makes it possible to prevent the occurrence of a turbulent flow around the substrate S. Thus, even if the liquid adheres to a surface of the substrate S, the liquid dissolves in the processing fluid in a supercritical state and carried downstream, thereby preventing the liquid from remaining on the dried substrate S. Furthermore, a direction of passage of the processing fluid is determined in such a manner that the aperture 121 where impurity to become a source of contamination is likely to arise is arranged downstream from the substrate S. This prevents impurity arising around the aperture 121 from being carried upstream by a turbulent flow and from adhering to the substrate. As a result, it becomes possible to dry the substrate S favorably without causing contamination.

However, the supercritical fluid has the property of being unstable particularly under temperature and pressure conditions close to degrees at a critical point, and minor change occurring in these conditions cause large density change. This might cause a turbulent flow in the processing space SP. For example, if there is a difference in flow rate or flow speed between the processing fluid supplied over the substrate S and the processing fluid supplied under the support tray 15, a turbulent flow resulting from the difference may be caused in the processing space SP. As another example, the processing fluid supplied under the support tray 15 may be increased in temperature by contacting the warmed support tray 15, and this may cause convection.

Figure 6A:
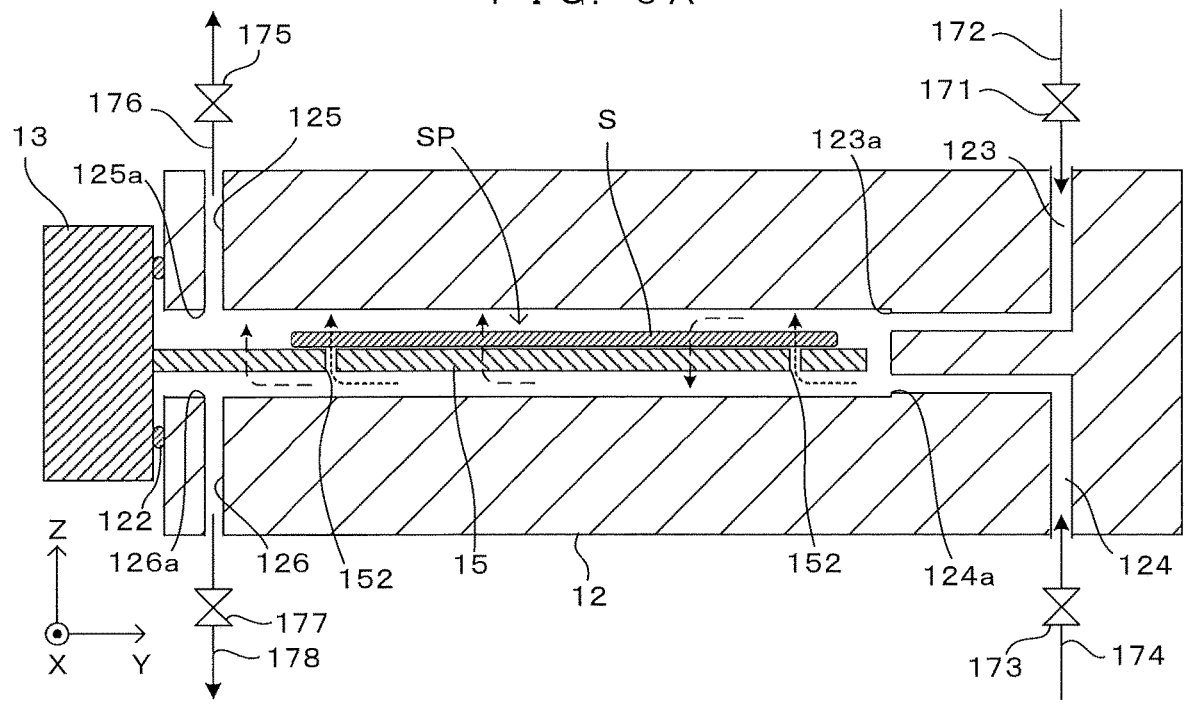
FIG. 6A is a drawing explaining a turbulent flow developed in the processing space and a method for suppressing the turbulent flow.
Figure 6B:
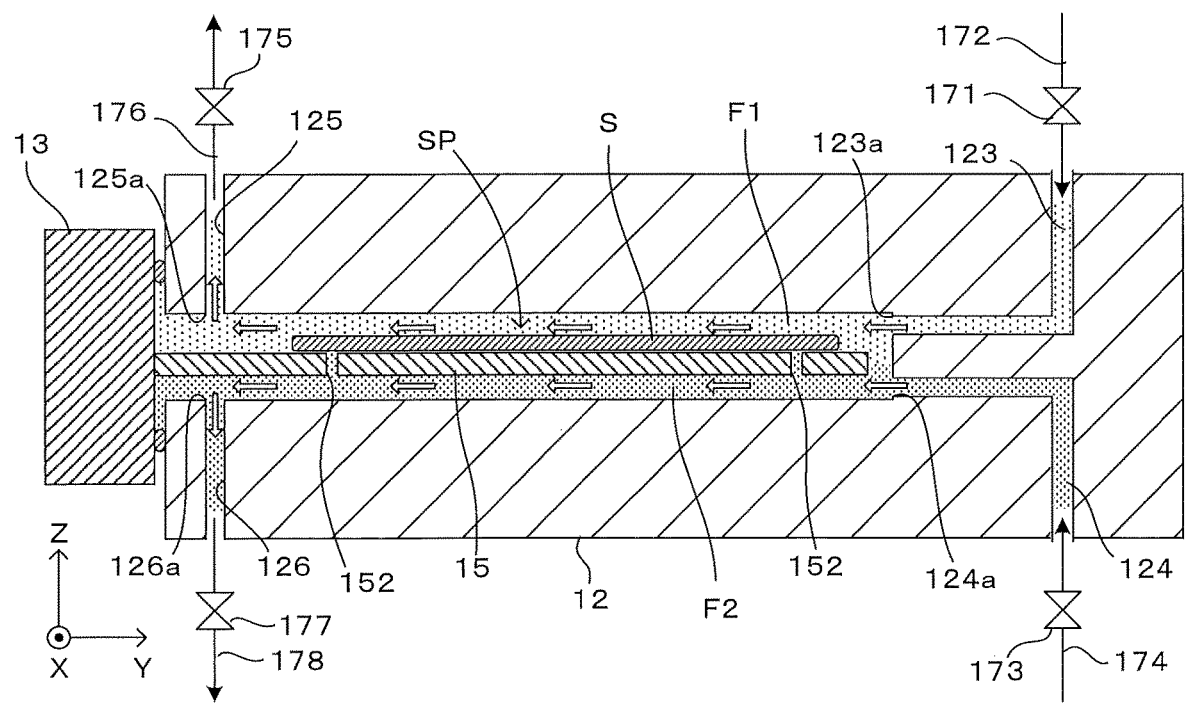
FIG. 6B is a drawing explaining a turbulent flow developed in the processing space and a method for suppressing the turbulent flow.

FIGS. 6A and 6B are drawings explaining a turbulent flow developed in the processing space and a method for suppressing the turbulent flow. More specifically, FIG. 6A shows an example of a turbulent flow that might be developed in the processing space SP. FIG. 6B shows a configuration for reducing the occurrence of the turbulent flow. The inventors of the present application analyzed a flow of the fluid in the processing space SP using computer simulation. Result thereof shows that, as indicated by arrows with dashes in FIG. 6A, slight change in a condition for supply is found to cause a current in the top-bottom direction through a gap from the substrate S and the support tray 15 to the inner wall surface of the processing space SP, namely, to cause a turbulent flow. As indicated by arrows with dots, in the presence of the through holes 152 at the support tray 15, the occurrence of a turbulent flow through these through holes 152 is also determined. In particular, a turbulent flow toward the substrate S is not preferable as it makes impurity as a source of contamination approach the substrate S.

In response to this problem, in the present embodiment, a significant difference in temperature is provided between the processing fluid to be supplied over the substrate S and the processing fluid to be supplied under the support tray 15. More specifically, as shown in FIG. 6B, while the processing fluid to be supplied to the first introduction flow passage 123 is placed at a temperature T1 as a relatively high temperature, the processing fluid to be supplied to the second introduction flow passage 124 is placed at a temperature T2 (<T1) as a lower temperature. By doing so, while a processing fluid F1 flowing over the substrate S is given a relatively low density, a processing fluid F2 flowing under the support tray 15 is given a higher density. This difference in density reduces the occurrence of a current from an upper layer toward a lower layer or from the lower layer toward the upper layer. Then, as shown in FIG. 6B given dots of different densities, the processing fluid F1 is to flow as a laminar flow over the substrate S and the processing fluid F2 is to flow as a laminar flow under the support tray 15. By doing so, the occurrence of a turbulent flow is reduced, thereby allowing prevention of contamination of the substrate S.

Both the temperatures T1 and T2 are required to be temperatures at which a supercritical state is maintained stably. If the processing fluid is carbon dioxide, a pressure and a temperature at a critical point are 7.38 MPa and 31.1° C. respectively as described above. Thus, a pressure and a temperature are required not to fall below their values at a critical point. The temperature T1 is adjusted within a range from 45 to 75° C., for example. The temperature T2 is adjusted in a range from 35 to 65° C., for example, to be lower than the temperature T1. Furthermore, a difference in temperature is desirably adjusted in such a manner that the temperature T1 becomes higher than the temperature T2 by a degree from about 10 to about 20° C.

The following describes a more specific system configuration for fulfilling such conditions by using some examples. The description given above is intended for explanation of the principles, so that connection from each of the first introduction flow passage 123 and the second introduction flow passage 124 to the fluid supplier 57 is described as being formed through a single valve and a single pipe. Actually, as shown in the examples given below, a more complicated route is prepared for supplying the processing fluid to introduce the processing fluid in a required state into the processing space SP as need arises.

Figure 7:
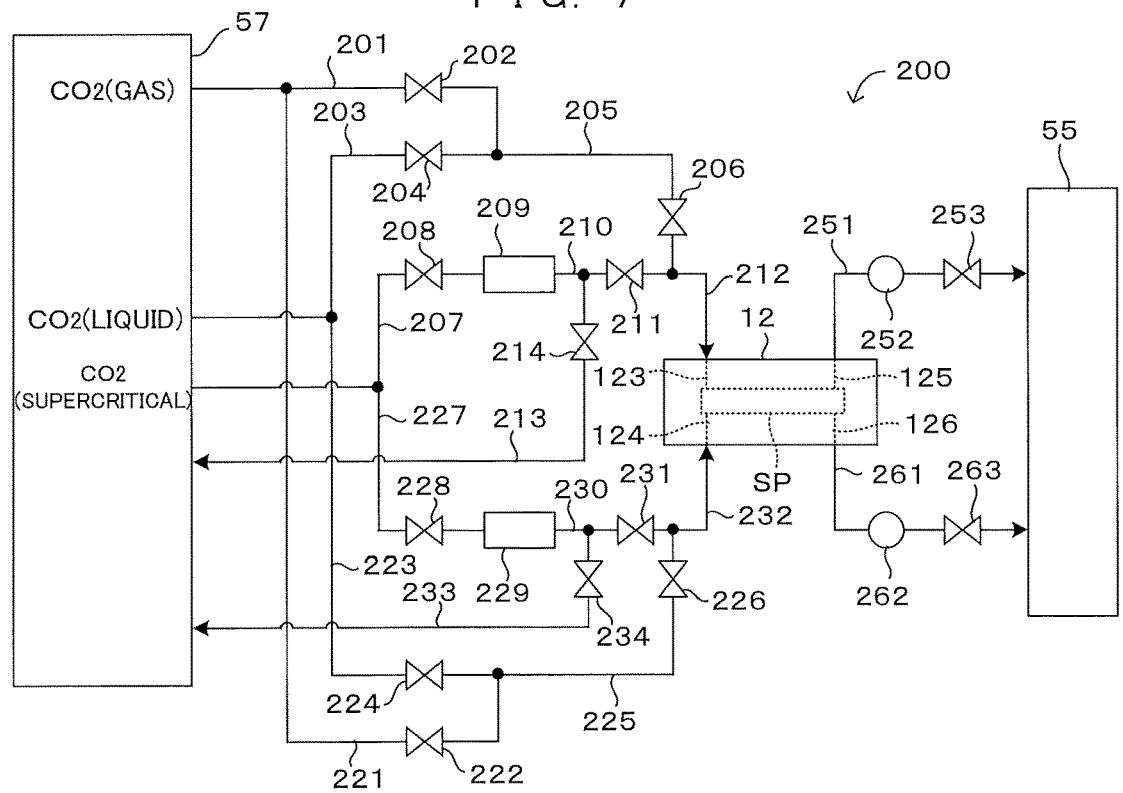
FIG. 7 is a drawing showing an example of a passage route for the processing fluid.

FIG. 7 is a drawing which shows an example of a passage route for the processing fluid. In the following description, a reference sign 200 is given to a piping system as a whole provided as a fluid passage route between the fluid supplier 57 and the processing chamber 12 and between the processing chamber 12 and the fluid collector 55. In this example, the fluid supplier 57 has the function of supplying carbon dioxide ($CO_2$) as the processing fluid in the state of each of a gas phase, a liquid phase, and a supercritical state.

Output from gaseous $CO_2$ branches into two pipes 201 and 221. A valve 202 is interposed in the pipe 201 as one of these pipes. A valve 222 is interposed in the other pipe 221. Likewise, output from liquid $CO_2$ branches into two pipes 203 and 223. A valve 204 is interposed in the pipe 203 as one of these pipes. A valve 224 is interposed in the other pipe 223.

Output from supercritical $CO_2$ branches into two pipes 207 and 227. A valve 208 is interposed in the pipe 207 as one of these pipes. A heater 209 is provided to the output side of the valve 208. A valve 211 is interposed in a pipe 210 connected to the output side of the heater 209. Likewise, a valve 228 is interposed in the other pipe 227 and a heater 229 is provided to the output side of the valve 228. A valve 231 is interposed in a pipe 230 connected to the output side of the heater 229.

The pipes 201 and 203 merge on the output sides of the valves 202 and 204 respectively into a pipe 205. A valve 206 is interposed in the pipe 205. The pipes 205 and 210 merge on the output sides of the valves 206 and 211 respectively into a pipe 212, and the pipe 212 is connected to the first introduction flow passage 123 of the processing chamber 12. Likewise, the pipes 221 and 223 merge on the output sides of the valves 222 and 224 respectively into a pipe 225. A valve 226 is interposed in the pipe 225. The pipes 225 and 230 merge on the output sides of the valves 226 and 231 respectively into a pipe 232, and the pipe 232 is connected to the second introduction flow passage 124 of the processing chamber 12.

In FIG. 7 and its subsequent drawings, priority is given to showing a flow of the processing fluid clearly. For this reason, the locations of the first introduction flow passage 123, the second introduction flow passage 124, the first discharge flow passage 125, and the second discharge flow passage 126 are different from those shown in FIG. 5 and other drawings. More specifically, the position of the introduction flow passage and that of the discharge flow passage relative to each other are reversed between FIGS. 7 and 5 in terms of right and left.

A pipe 213 branches from the pipe 210 on the output side of the heater 209 and a valve 214 is interposed in the pipe 213. Likewise, a pipe 233 branches from the pipe 230 on the output side of the heater 229 and a valve 234 is interposed in the pipe 233. The pipes 213 and 233 are provided as a circulation route for causing a supercritical fluid along the pipes to flow back to the fluid supplier 57.

A pipe 251 is connected to the first discharge flow passage 125 of the processing chamber 12. A temperature sensor 252 and a valve 253 are interposed in the pipe 251. The output side of the valve 253 is connected to the fluid collector 55. Likewise, a pipe 261 is connected to the second discharge flow passage 126. A temperature sensor 262 for detecting the temperature of the fluid and a valve 263 are interposed in the pipe 261. The output side of the valve 263 is connected to the fluid collector 55.

The above-described valves operate in response to control commands from the control unit 90 to open and close the pipes and to make flow rate adjustment. In particular, during supply of the supercritical fluid into the processing space SP, a degree of opening of each of the valves on the passage route is adjusted in such a manner as to provide equality between the flow rate of the processing fluid to be supplied to the first introduction flow passage 123 and the flow rate of the processing fluid to be discharged from the first discharge flow passage 125 of the processing chamber 12, and to provide equality between the flow rate of the processing fluid to be supplied to the second introduction flow passage 124 and the flow rate of the processing fluid to be discharged from the second discharge flow passage 126 of the processing chamber 12.

It is not preferable that a ratio between the amount of the processing fluid to be supplied to the first introduction flow passage 123 and the amount of the processing fluid to be supplied to the second introduction flow passage 124 is too large or too small. The reason for this is that such cases might cause a phenomenon that the processing fluid traveling under the substrate S flows upward over the substrate S or conversely, the processing fluid traveling over the substrate S overflows downward. The flow rate of the processing fluid to be supplied to the first introduction flow passage 123 and the flow rate of the processing fluid to be supplied to the second introduction flow passage 124 is desirably set in a range from 1:5 to 5:1 according to a ratio between the respective sectional areas of the passages over the substrate and under the substrate.

The heaters 209 and 229 are controlled by the temperature controller 59 of the supply unit 50 and make adjustment to a target temperature by heating the passed fluid. For this purpose, the heaters 209 and 229 are provided with temperature sensors (not shown in the drawings) for detecting the temperature of the fluid. Outputs from these temperature sensors and those of the temperature sensors 252 and 262 are given to the temperature controller 59. On the basis of the given outputs, the temperature controller 59 controls electric conductions at the heaters 209 and 229.

In terms of connection with the supercritical drying process shown in FIG. 4, in step S201 of supplying the processing fluid in a gas phase, the valves 202, 206, 222, and 226 along the route from gas output from the fluid supplier 57 to the processing chamber 12 are opened. By doing so, gaseous carbon dioxide ($CO_2$) is supplied as the processing fluid into the processing space SP. On the other hand, in step S202 of supplying the processing fluid in a liquid phase, the valves 204, 206, 224, and 226 along the route from liquid output from the fluid supplier 57 to the processing chamber 12 are opened. By doing so, liquid carbon dioxide ($CO_2$) is supplied as the processing fluid into the processing space SP.

In step S204 of supplying the supercritical fluid as the processing fluid, the valves 208, 211, 228, and 231 along the route from supercritical output from the fluid supplier 57 to the processing chamber 12 are opened. By doing so, the supercritical fluid output through the heater 209 is supplied to the first introduction flow passage 123 of the processing chamber 12, and the supercritical fluid output through the heater 229 is supplied to the second introduction flow passage 124 of the processing chamber 12.

The valves 253 and 263 are opened at appropriate times in response to control commands from the control unit 90. By doing so, the amount of discharge of the processing fluid from the processing space SP is adjusted. Causing the valves to operate in cooperation with each other in response to the progress of the supercritical drying process in this way allows the processing fluid to be supplied into the processing chamber 12 and allows the processing fluid to be discharged from the processing chamber 12 in a manner responsive to the process.

Setting the different target temperatures for the heaters 209 and 229 makes it possible to make a difference between the temperature of the processing fluid to be supplied from the first introduction flow passage 123 and that of the processing fluid to be supplied from the second introduction flow passage 124 into the processing space SP. More specifically, the target temperature for the heater 209 can be set to the temperature T1 and the target temperature for the heater 229 can be set to the temperature T2, for example. Here, T1>T2. These target temperatures may be set higher than the temperatures T1 and T2 in anticipation of temperature reduction in the pipes.

Regarding the processing fluid in a supercritical state, the temperature or pressure of this processing fluid changes as a result of stay thereof or pressure loss occurring in the pipe. Hence, the processing fluid supplied into the processing space SP may be in a state differing from an intended state. For example, even if the temperature of the processing fluid at the output from the heater 209 or 229 conforms to the target temperature, the processing fluid may be cooled in the pipe to reduce the temperature thereof from its intended temperature when it is introduced into the processing space SP.

The following means are applicable to solve this problem, for example. A first method is to always circulate outputs from the heaters 209 and 229. More specifically, in the absence of feed of the supercritical fluid into the processing chamber 12, specifically, when the valves 211 and 231 are closed, the valves 214 and 234 are opened to form the circulation route for the supercritical fluid through the pipes 213 and 233. By doing so, the supercritical fluid controlled at the target temperature is caused to always circulate through the circulation route. As a result, a temperature in the pipe is not reduced when supply is unnecessary while the processing fluid at a predetermined temperature can be supplied readily in response to need.

A second method is to use result of temperature detection on the discharge side. Specifically, the temperature of the processing fluid flowing over the substrate S in the processing space SP can be detected by causing the temperature sensor 252 to detect the temperature of the processing fluid discharged from the first discharge flow passage 125 through the pipe 251. Also, the temperature of the processing fluid flowing under the support tray 15 in the processing space SP can be detected by causing the temperature sensor 262 to detect the temperature of the processing fluid discharged from the second discharge flow passage 126 through the pipe 261. These results of the temperature detection are fed back to the temperature control at the heaters 209 and 229 to allow the temperatures of the processing fluid flowing in the processing space SP to approximate to the intended target temperatures T1 and T2.

This method also works effectively if a factor for changing the temperature of the processing fluid is present inside the processing space SP. For example, if the temperature of the warmed support tray 15 is higher than the temperature of the processing fluid supplied under the support tray 15, an upward flow might be developed in the processing space SP as a result of warming of the processing fluid. The temperature sensor provided along the discharge route is available for detection of such temperature change. Thus, by feeding result of the detection back to the heater control, the occurrence of a turbulent flow can be prevented.

In principle, as long as the temperature of the warmed support tray 15 is lower than the temperature T1 of the processing fluid F1 in the upper layer, even if the processing fluid F2 in the lower layer is warmed by the support tray 15, convection between the lower layer and the upper layer is not developed. Further, even if the temperature of the support tray 15 is higher than the temperature T1 of the processing fluid F1 in the upper layer, temperature increase to such a degree as to develop convection is considered to be unlikely as long as the temperature T2 of the processing fluid F2 in the lower layer is sufficiently low.

Regarding the description given above about the apparatus configuration shown in FIG. 7, part of this description relating to control and some modifications thereof are also applicable in the same way to the cases listed below. Thus, in each of the following cases, description about control will be omitted unless particularly necessary.

In the piping system 200 in the above-described case, the passage routes for the processing fluid in respective states including a gas phase, a liquid phase, and a supercritical phase are separated from each other and the route shared among these states is minimized. This makes it possible to set the temperatures of the processing fluid in the respective states individually and to optimize these temperatures individually in response to purpose of the process. Thus, the supercritical drying process can be performed under an optimum condition to allow the substrate S to be dried favorably. Furthermore, eliminating the need to change the temperature of the fluid in response to the progress of the process acts advantageously in terms of the throughput of the process.

Figure 8:
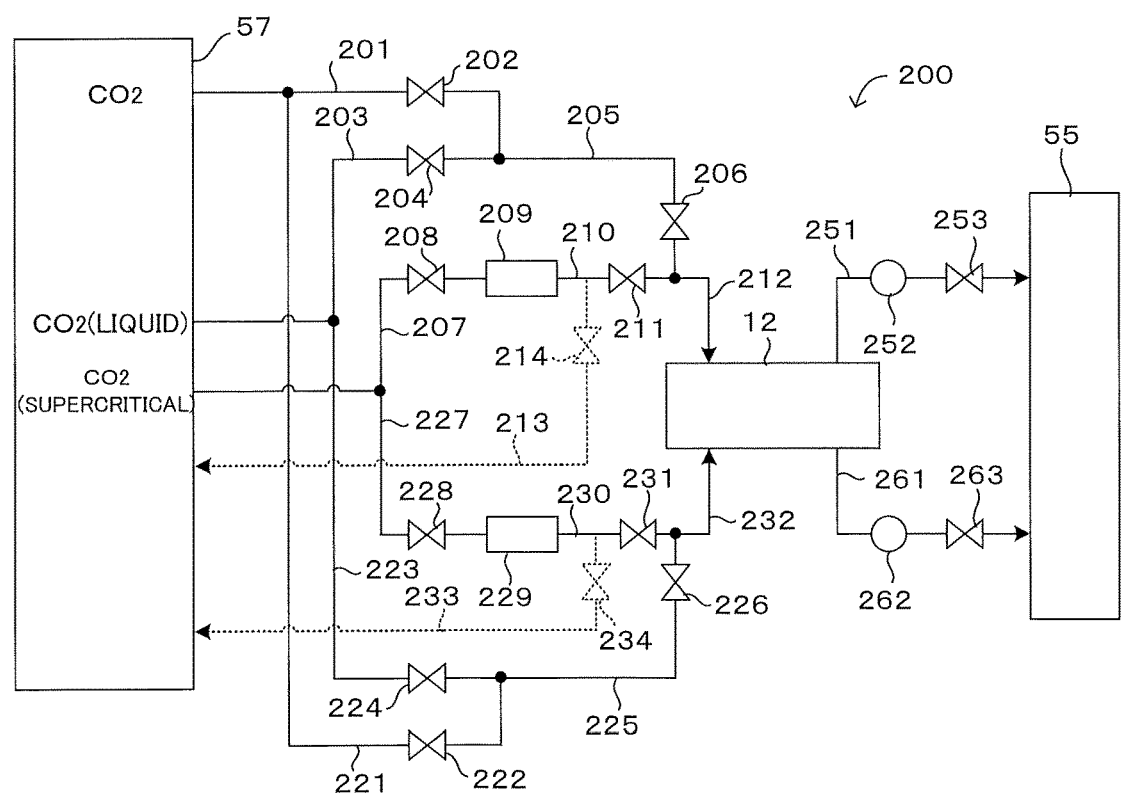
FIG. 8 is a drawing showing another example of the passage route for the processing fluid.

FIG. 8 is a drawing which shows another example of the passage route for the processing fluid. In FIG. 8 and its subsequent drawings, a structure common or corresponding to that shown in FIG. 7 is given the same sign and such a structure will not be described individually. Furthermore, since connection between the processing chamber 12 and each pipe is common among the cases, the illustration of the internal configuration of the processing chamber 12 is omitted from the drawings.

In the case shown in FIG. 8, some of the structures shown in FIG. 7 are omitted and the omitted structures are indicated by dotted lines. As understood from this, in this case, the pipes 213 and 233 and the valves 214 and 234 forming the circulation route for the supercritical fluid are omitted. By doing so, since the supercritical fluid is not circulated when it is not used, temperature controllability may reduce to some extent over the supercritical fluid immediately after start of its supply. Instead of this, the apparatus can be given a simpler configuration.

A possible problem relating to the reduction in temperature controllability can be avoided as follows before it occurs. For example, the pressure of the processing fluid fed from the fluid supplier 57 and a target temperature for the heater are set in such a manner as to provide sufficient margins from their degrees at a critical point. As another example, a sufficient difference may be made between a target temperature for the heater 209 and a target temperature for the heater 229.

Figure 9:
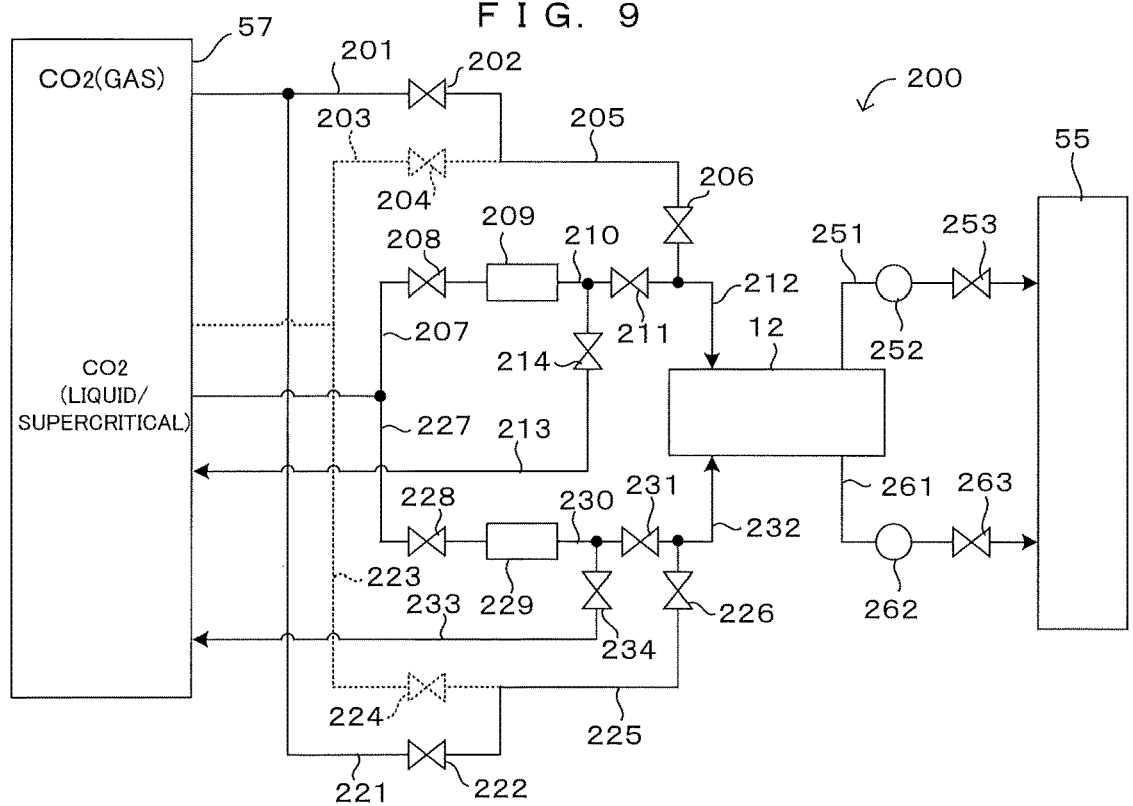
FIG. 9 is a drawing showing another example of the passage route for the processing fluid.

FIG. 9 is a drawing which shows another example of the passage route for the processing fluid. In this case, in comparison to the configuration in FIG. 7, the pipes 203 and 223 for passage of liquid carbon dioxide and their accompanying valves 204 and 224 are omitted. In this case, the processing fluid in a liquid phase and the processing fluid in a supercritical state are supplied from a common source and are switched by the presence or absence of heating using the heaters. Specifically, if the temperature of the processing fluid output at a high pressure from the fluid supplier 57 is lower than that at a critical point, the processing fluid becomes a liquid fluid. Meanwhile, if the temperature of the processing fluid is increased to be higher than that at a critical point in response to heating using the heater, the processing fluid becomes a fluid in a supercritical state.

As described above, using the partially common supply source of the processing fluid achieves further simplified configurations of the fluid supplier 57 and the pipes. While such configurations may require longer time for changing the processing fluid from a liquid phase to a supercritical state than that in the above-described case, they are still available for performing the process in the same way. Like in the above-described case, a modification of this case can be made by further omitting the pipes 213 and 233 and the valves 214 and 234 to form the circulation route.

Figure 10:
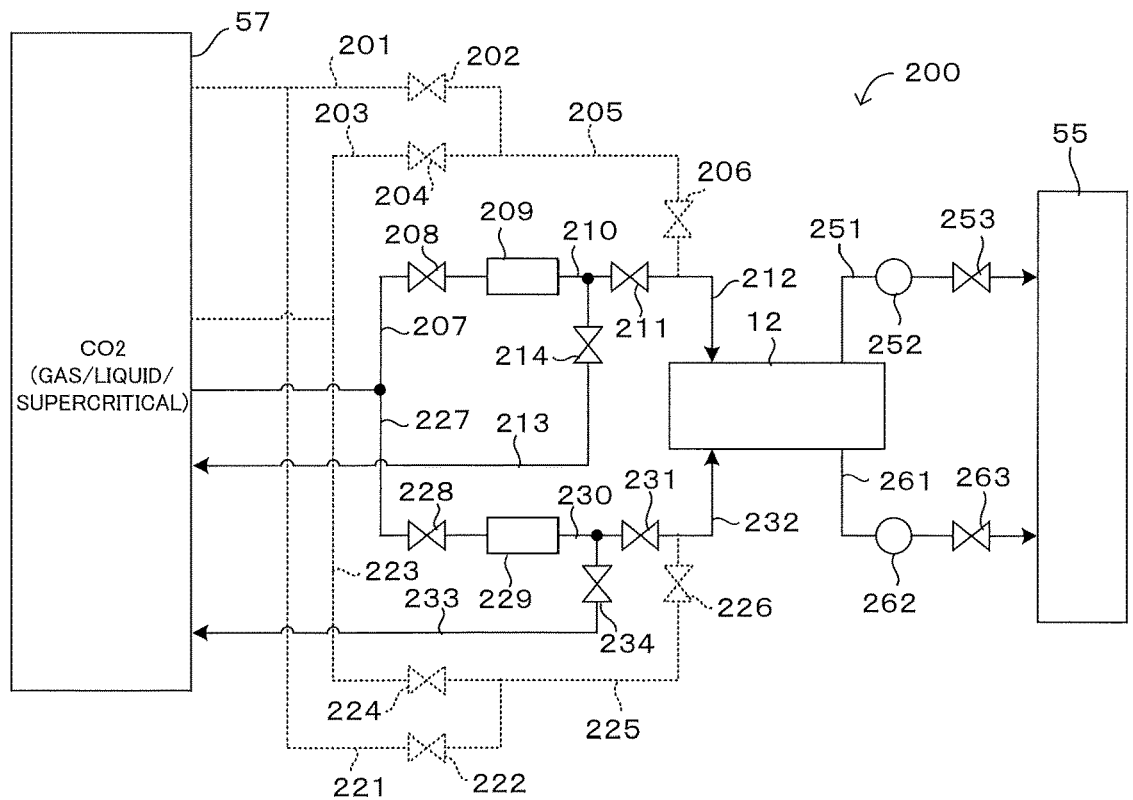
FIG. 10 is a drawing showing another example of the passage route for the processing fluid.

FIG. 10 is a drawing which shows another example of the passage route for the processing fluid. In this case, in comparison to the configuration in FIG. 7, the pipes 203 and 223 for passage of liquid carbon dioxide and their accompanying valves 204 and 224 are omitted, and the pipes 201 and 221 for passage of gaseous carbon dioxide and their accompanying valves 202 and 222 are omitted. In this case, the processing fluid in a gas phase, the processing fluid in a liquid phase, and the processing fluid in a supercritical state are supplied to the processing chamber 12 through a common route. Thus, change between these phases is controlled on the basis of the pressure of the fluid to be fed and results of temperature adjustment using the heaters 209 and 229. More simply, by causing the fluid supplier 57 to supply the processing fluid at a high pressure and at a low temperature, it becomes possible to realize a gas phase, a liquid phase, and a supercritical state only through the temperature adjustment.

In this case, time required for the phase change might cause corresponding reduction in throughput. On the other hand, the simplest apparatus configurations can be given to the fluid supplier 57 and the piping system 200. A modification of this case can also be made by further omitting the pipes 213 and 233 and the valves 214 and 234 to form the circulation route. According to this modification, the processing fluids of respective phases are passed through the same pipe and stay of the processing fluids does not occur during the course of the supercritical drying process. This contributes to fulfilment of the effect of preventing impurity to become a source of contamination from staying in the passage route for the processing fluid.

As described above, in the substrate processing apparatus 1 of the embodiment, the processing chamber 12 corresponding to a "chamber body" of the invention and the lid part 13 function integrally as a "processing container" of the invention, and the aperture 121 corresponds to an "aperture" of the invention. While the first introduction port and the second introduction port correspond to "introduction ports" of the invention, the first discharge port and the second discharge port correspond to "discharge ports" of the invention. Further, temperatures T1, T2 correspond to a "first temperature" and a "second temperature" of the invention, respectively.

Further, in the above embodiment, the pipes 207, 210, 212 function integrally as a "first supply flow passage" of the invention, and the pipes 227, 230, 232 function integrally as a "second supply flow passage" of the invention. The heater 209, 219 function as a "temperature adjuster" of the invention. The temperature sensor 252, 262 function as a "temperature detector" of the invention. Furthermore, the control unit 90 and the valves connected thereof function as a "flow rate controller" of the invention.

Note that the invention is not limited to the above embodiment and various changes other than the aforementioned ones can be made without departing from the gist of the invention. For example, in the above-described embodiment, carbon dioxide is used as a processing fluid for the supercritical process and IPA is used as a liquid for forming a liquid film. However, these are shown merely as examples and chemical substances to be used are not limited to these.

Further, the support tray 15 of the above-described embodiment includes the built-in heater and includes the through hole 152 for causing the lift pin 37 to pass therethrough. However, even if at least one of these members is not provided, it is still possible to achieve operation and effect comparable to those of the above-described embodiment. For this reason, a lift pin is not always required as an intermediary of transfer of a substrate to and from outside. As an example, the external transport device may be configured to place the substrate directly on the support tray. In this case, the transfer unit 30 is omissible.

In the piping system 200 of the above-described embodiment, the heater 209 is provided along the route for the supercritical fluid connected to the first introduction flow passage 123, and the heater 229 is provided along the route for the supercritical fluid connected to the second introduction flow passage 124. However, the heater may be omitted from one of these routes. As an example, if the fluid supplier 57 is configured to output the supercritical fluid having a temperature preferable for supply to the second introduction flow passage 124, the output supercritical fluid may be supplied as it is to the second introduction flow passage 124 while the supercritical fluid heated by the heater 209 is supplied to the first introduction flow passage 123. In this case, a temperature adjusting function can be considered to be occupied by the fluid supplier.

Further, in the above-described embodiment, during supply to the first introduction port 123a and the second introduction port 124a, the processing fluid is passed in the horizontal direction. Instead of this, a direction in which the processing fluid is passed may be adjusted using a rectifying mechanism provided in the processing space SP, for example. Meanwhile, a configuration to cause mixture between the processing fluid introduced from the first introduction port and the processing fluid introduced from the second introduction port is desirably avoided.

As described above by presenting the specific embodiment, in the substrate processing apparatus according to the present invention, the aperture may be provided at a side surface of the container body, the first introduction port and the second introduction port may be provided on the opposite side of the aperture in a plan view as viewed from the substrate, and the first discharge port and the second discharge port may be provided closer to the aperture than the substrate, for example. In this configuration, a flow of the processing fluid is formed from the back side toward the front side of the substrate as viewed from the aperture. Impurity to become a source of contamination is likely to arise around the aperture. By locating the aperture downstream from the substrate as viewed in the direction of passage of the processing fluid, adhesion of impurity to the substrate is avoided.

As another example, a first supply flow passage and a second supply flow passage may be provided that extend from the fluid supplier and are connected to the first introduction port and the second introduction port respectively, and at least one of the first supply flow passage and the second supply flow passage may be provided with a temperature adjuster that adjusts the temperature of the processing fluid. This configuration allows the temperature of the processing fluid to be supplied to the first introduction port and that of the processing fluid to be supplied to the second introduction port to be set individually.

As another example, the temperature adjuster may change the phase of the processing fluid between a gas phase, a liquid phase, and a supercritical state by changing the temperature of the processing fluid. If the pressure and temperature of the processing fluid output from the fluid supplier are set properly, these three phases can be realized by changing the set temperature. This achieves simplification of the configuration of the apparatus.

As another example, the configuration may include a temperature detector that detects the temperature of the processing fluid discharged from the first discharge port and that of the processing fluid discharged from the second discharge port individually, and a temperature controller that controls the temperature adjuster on the basis of result of the detection by the temperature detector. In this configuration, result about an actually measured temperature of the processing fluid discharged from the processing space is reflected in the temperature control over the processing fluid. This makes it possible to reduce influence from temperature change of the processing fluid occurring along the passage and in the processing space.

As another example, in one configuration, a flow rate may be controlled to provide equality between the amount of the processing fluid to flow in from the first introduction port and the amount of the processing fluid to flow out from the first discharge port and to provide equality between the amount of the processing fluid to flow in from the second introduction port and the amount of the processing fluid to flow out from the second discharge port. In this configuration, balance is attained in the processing space between the amount of supply and the amount of discharge of the processing fluid in each of the upper layer and the lower layer relative to the substrate. It makes possible to prevent the occurrence of a turbulent flow to be caused by the passage of the processing fluid between the upper layer and the lower layer.

As another example, a flow direction of the processing fluid from the first introduction port to the processing space and a flow direction of the processing fluid from the second introduction port to the processing space may be horizontal. In this configuration, the substrate supported in a horizontal posture in the processing space can be supplied with the processing fluid passed in the direction along a main surface of the substrate. By doing so, laminate flows are formed both over and under the substrate, thereby allowing reduction in the occurrence of a turbulent flow to cause contamination.

As another example, the lid part may be configured to be attached to the container body through a sealing member surrounding the aperture. This configuration can increase airtightness between the container body and the lid part. On the other hand, this might cause elusion of impurity from the sealing member into the processing fluid. In this regard, applying the present invention prevents impurity eluted from the sealing member from adhering to the substrate.

As another example, the processing fluid may be carbon dioxide. In one configuration, the substrate may be transported into the processing container while an upper surface of the substrate is covered with a liquid film of an organic solvent, and the processing fluid may be carbon dioxide, for example. Carbon dioxide is highly soluble in various types of processing liquids or organic solvents used for substrate process and its critical point is relatively close to ordinary temperature and ordinary pressure. Thus, carbon dioxide is preferably available as a processing fluid for supercritical process.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

INDUSTRIAL APPLICABILITY

The present invention is applicable to every type of substrate processing apparatus that processes a substrate using a supercritical fluid. In particular, the present invention is preferably applicable to a substrate drying process of drying a substrate such as a semiconductor substrate with a supercritical fluid.

REFERENCE SIGNS LIST 1 substrate processing apparatus
13 lid part
15 support tray
57 fluid supplier
59 temperature controller
90 control unit (flow rate controller)
121 aperture (aperture)
123$a$ first introduction port
124$a$ second introduction port
125$a$ first discharge port
126$a$ second discharge port
207, 210, 212 pipes (first supply flow passage)
209, 229 heater (temperature adjuster)
227, 230, 232 pipes (second supply flow passage)
252, 262 temperature sensor (temperature detector)
S substrate
SP processing space
T1 first temperature
T2 second temperature

The invention claimed is:

1. A substrate processing apparatus comprising:
a support tray which has a flat plate shape and supports a lower surface of a substrate in a horizontal posture;
a processing container which houses the support tray within a processing space disposed inside;
a fluid supplier which supplies a processing fluid for supercritical process into the processing space, wherein:
the processing container includes a container body and a lid part, the container body being provided with processing space configured to house the support tray supporting the substrate and an aperture communicating with the processing space for causing the support tray to pass through, the lid part opening and closing the aperture;
the processing container is provided with a first introduction port and a second introduction port which introduce the processing fluid to the processing space and a first discharge port and a second discharge port which discharge the processing fluid from the processing space;
the first introduction port is formed external to one end of the substrate in a plan view in such a manner as to face space over the substrate in the processing space;
the second introduction port is formed external to the one end in such a manner as to face space under the support tray in the processing space;
the first discharge port is formed external to an other end of the substrate opposite the one end in a plan view in such a manner as to face space over the support tray in the processing space;
the second discharge port is formed external to the other end in such a manner as to face the space under the support tray in the processing space; and
the fluid supplier supplies the processing fluid in a supercritical state and at a predetermined first temperature into the processing space through the first introduction port and supplies the processing fluid in a supercritical state and at a second temperature lower than the first temperature into the processing space through the second introduction port.

2. The substrate processing apparatus according to claim 1, wherein
the aperture is provided at a side surface of the container body,
the first introduction port and the second introduction port are provided on the opposite side of the aperture in a plan view as viewed from the substrate, and
the first discharge port and the second discharge port are provided closer to the aperture than the substrate.

3. The substrate processing apparatus according to claim 1, further comprising a first supply flow passage which connects the fluid supplier and the first introduction port and a second supply flow passage which connects the fluid supplier and the second introduction port, wherein
at least one of the first supply flow passage and the second supply flow passage is provided with a temperature adjuster which adjusts temperature of the processing fluid.

4. The substrate processing apparatus according to claim 3, wherein the temperature adjuster changes the temperature of the processing fluid, thereby makes a phase of the processing fluid change among a gas phase, a liquid phase and a supercritical state.

5. The substrate processing apparatus according to claim 3, further comprising:
a temperature detector which detects the temperature of the processing fluid discharged from each of the first discharge port and the second discharge port individually; and
a temperature controller which controls the temperature adjuster based on a detection result by the temperature detector.

6. The substrate processing apparatus according to claim 1, further comprising flow rate controller, wherein
the flow rate controller makes an amount of the processing fluid to flow in from the first introduction port and an amount of the processing fluid to flow out from the first discharge port equal, and makes an amount of the processing fluid to flow in from the second introduction port and an amount of the processing fluid to flow out from the second discharge port equal.

7. The substrate processing apparatus according to claim 1, wherein a flow direction of the processing fluid from the first introduction port to the processing space and a flow direction of the processing fluid from the second introduction port to the processing space are horizontal.

8. The substrate processing apparatus according to claim 1, wherein the lid part may is attached to the container body through a sealing member surrounding the aperture.

9. The substrate processing apparatus according to claim 1, wherein the processing fluid is carbon dioxide.

10. A substrate processing method of processing a substrate with a processing fluid in a supercritical state in a processing container, wherein
the processing container includes a container body and a lid part, the container body being provided with processing space configured to house the support tray supporting the substrate and an aperture communicating with the processing space for causing the support tray to pass through, the lid part being configured to open and close the aperture;
the processing container is provided with a first introduction port and a second introduction port which introduce the processing fluid to the processing space and a first discharge port and a second discharge port which discharge the processing fluid from the processing space;
the first introduction port is formed external to one end of the substrate in a plan view in such a manner as to face space over the substrate in the processing space;
the second introduction port is formed external to the one end in such a manner as to face space under the support tray in the processing space;
the first discharge port is formed external to an other end of the substrate opposite the one end in a plan view in such a manner as to face space over the support tray in the processing space;
the second discharge port is formed external to the other end in such a manner as to face the space under the support tray in the processing space; and
the processing fluid in a supercritical state and at a predetermined first temperature is supplied into the processing space through the first introduction port and the processing fluid in a supercritical state and at a second temperature lower than the first temperature is supplied into the processing space through the second introduction port.

11. The substrate processing method according to claim 10, wherein the substrate is transported into the processing container in a state that an upper surface of the substrate is covered with a liquid film of an organic solvent, and the processing fluid is carbon dioxide.

* * * * *